United States Patent

[11] 3,620,827

[72] Inventor Marnix Guillaume Collet
Emmasingel, Eindhoven, Netherlands

[21] Appl. No. 730,436
[22] Filed May 20, 1968
[45] Patented Nov. 16, 1971
[73] Assignee U. S. Philips Corporation
New York, N.Y.
[32] Priority May 31, 1967
[33] Netherlands
[31] 6707515

[54] METHOD OF APPLYING A LAYER OF SILICON NITRIDE

7 Claims, 3 Drawing Figs.

[52] U.S. Cl. .......... 117/200, 117/201, 117/93.3, 117/106 A, 317/235 B
[51] Int. Cl. .......... H01b 1/04
[50] Field of Search .......... 117/200, 201, 93.3, 106 A

[56] References Cited

UNITED STATES PATENTS

| | | | |
|---|---|---|---|
| 2,839,426 | 6/1958 | Gerby | 117/106 |
| 3,385,729 | 5/1968 | Larchian | 117/200 |
| 3,419,761 | 12/1968 | Pennebaker | 117/106 X |

*Primary Examiner*—William L. Jarvis
*Attorney*—Frank R. Trifari

ABSTRACT: A method of applying a layer of silicon nitride to the surface of a semiconductor substrate wherein the silicon nitride is formed in a gaseous phase containing compounds of silicon and nitrogen which decompose and react in the presence of high-energy radiation e.g. ultraviolet radiation present in the gaseous phase to produce silicon nitride.

INVENTOR.
MARNIX G. COLLET
BY
[signature]
AGENT

METHOD OF APPLYING A LAYER OF SILICON NITRIDE

The invention relates to a method of applying a layer of silicon nitride to a substrate surface, more particularly a semiconductor substrate surface, from a gaseous phase containing compounds of silicon and of nitrogen.

A semiconductor substrate is to be understood to mean herein not only the semiconductor body itself but also any insulating, passivating or conducting layers applied to the semiconductor body.

A layer of silicon nitride is to be understood to mean herein a layer at least for the major part consisting of $Si_3N_4$, in which deviations from the stoichiometric composition are possible and which may also contain hydrogen compounds of silicon, of nitrogen or of silicon and nitrogen.

Silicon nitride layers are used in the technology of planar semiconductor devices for various purposes, for example, as a masking material for local diffusion of active impurities from the gaseous phase, as a screening from atmosphere influences and as a dielectric material in field effect transistors having an insulated gate electrode.

Various methods are known of applying such a silicon nitride layer to a substrate, which have the feature in common that the substrate temperatures generally exceed 500° C.

It is known, for example, that a silicon nitride layer can be deposited from a gas mixture containing silane and ammonia at temperatures lying between 600° C., and 1,000° C.

However, this high temperature is disadvantageous for a number of applications of the silicon nitride layer, for example, for the application to a semiconductor material containing a volatile constituent, for example, GaAs which can be decomposed while As evaporates, or for the application to finished semiconductor devices, for example, integrated circuits.

It has been proposed to form the silicon nitride layer at a low temperature by the use of a high-frequency gas discharge. This method requires a complicated apparatus and increases the risk of contaminating the compositions to be treated, for example, owing to the presence of additional parts in the treating space, such as electrodes, and owing to the possibility of sputtering resulting from ion bombardment.

The invention *inter alia* has for an object to mitigate the said disadvantages. It is based on the discovery that the layer can be formed in a simple manner at a low temperature if the energy required for the formation can be supplied by radiation which is rich in energy.

According to the invention, a method of the kind mentioned in the preamble is therefore characterized in that the silicon nitride is formed by means of a photoreaction.

The term photoreaction is employed herein to signify a reaction which proceeds under the influence of radiation absorbed by the gaseous phase. The radiation under whose influence the reaction proceed is preferably ultraviolet radiation, the energy content of which has been found satisfactory.

Although radiation from the so-called far or vacuum ultraviolet range of the spectrum can be absorbed by the gas mixture, the choice of the reaction vessel is limited, because many constructional materials absorb radiation of the said kind.

Therefore, it is advantageous to use radiation from the nearer ultraviolet range which is less sensitive to absorption by constructional materials and which is readily passed, for example, by quartz glass.

When radiation from the far ultraviolet range is dosed, the reacting compounds can directly absorb the radiation. In this case, the efficiency can also be increased by adding to the gaseous phase an agent which is operative when energy is transferred from a source of radiation to the reacting compounds. A photoreaction in which this indirect absorption of radiation energy is effected by means of an agent is referred to as a sensitized photoreaction.

When radiation from the near ultraviolet range is dosed, the reaction proceeds only when it has been sensitized. Operative atoms are, for example, Cd–and Zn–atoms, but preferably mercury atoms are added to the gaseous phase which are excited especially by radiation having a wavelength corresponding to the resonance line at 2,537 A and then transfer their excitation energy to the reacting compounds.

A mercury vapor pressure corresponding to the saturated mercury vapor pressure at the ambient temperature can be adjusted in a comparatively simple manner and is found to be on the one hand sufficiently large to cause the sensitized photoreaction to proceed and on the other hand so low that a disturbing contamination by mercury of the silicon nitride formed is avoided.

It has been found that amongst the silicon compounds a satisfactory yield of silicon nitride is obtained with the group of silanes and of this group especially with the monosilane ($SiH_4$).

The nitrogen compounds are preferably chosen from the nitrogen-hydrogen compounds, because with these compounds a high yield is obtained. This especially applies to hydrazine.

The method according to the invention is also particularly suitable for use in semiconductor bodies in which circuit elements are arranged. The silicon nitride layer can then be applied both to the semiconductor body itself and to the oxide layers applied to the semiconductor body, for example, for diffusion masking. This use has the advantage that the silicon nitride layer can be applied at a low temperature so that, for example, the diffusion pattern applied remains unchanged.

The method according to the invention may be used advantageously in semiconductor devices for detecting and/or measuring radiation which comprise a semiconductor body having three consecutive zones, the two outer zones being of opposite conductivity types and the intermediate zone being practically intrinsic and containing activators compensating each other.

In such detectors, the intrinsic zone can be obtained in known manner by the use of an activator having a large coefficient of diffusion in the relevant semiconductor material, a PN junction being provided in the semiconductor body and one of the zones adjoining the PN junction containing an excess of the said activator, while at an elevated temperature an external reverse voltage is applied to the PN junction. Ionized activators then move under the influence of the electric field in the barrier layer of the PN junction towards the other zone and constitute between the two zones of opposite conductivity types an intrinsic zone in which the impurities originally available are substantially completely compensated for.

It has been found that the surface of such detectors containing silicon nitride can hardly be passivated because the high temperatures used for applying the oxide considerably increase the leakage currents of the detectors.

The use of a method according to the invention for such detectors is based on the discovery that with passivation by silicon oxide the aforesaid compensating activators, in most cases lithium atoms, can be gettered at the interface semiconductor silicon oxide so that the concentration distribution is modified and the satisfactory compensation is adversely affected.

Although any method can be used in which at least the surface of the intrinsic zone of such a detector is coated with a silicon nitride layer without the interposition of an oxide layer while avoiding elevated temperatures, the method according to the invention is preferred.

The invention further relates to substrates, more particularly semiconductor substrates, to which a silicon nitride layer is applied means of a method according to the invention, and to semiconductor devices for detecting and/or measuring radiation which comprise a semiconductor body having 3 consecutive zones, the 2 outer zones being of opposite conductivity types and the intermediate zone being practically intrinsic and containing activators compensating each other, characterized in that at least the surface of the intrinsic zone is provided with a silicon nitride layer preferably applied by a method according to the invention.

The invention will now be described more fully, by way of example, with reference to the accompanying drawing.

Figure 1:
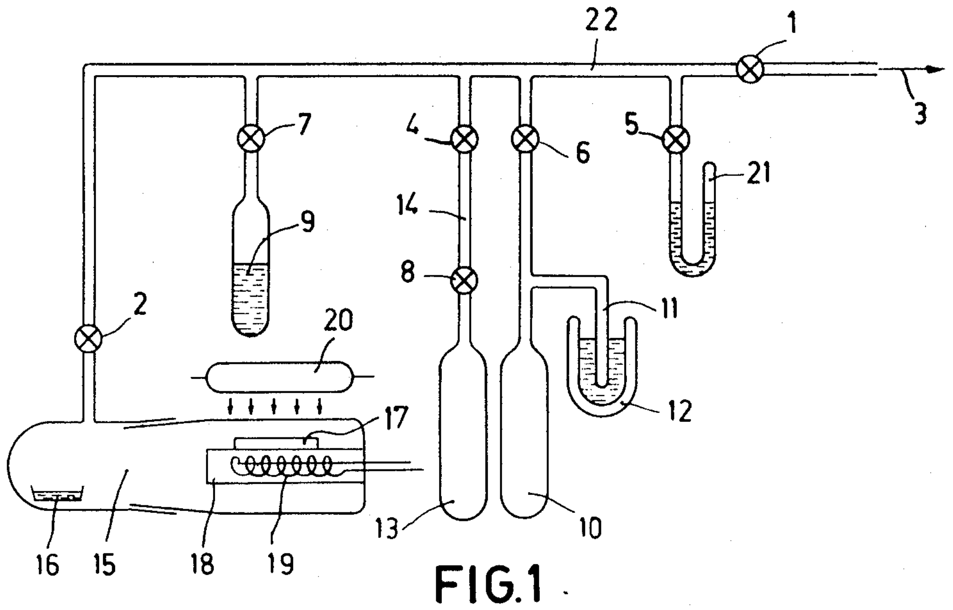
FIG. 1 is a perspective view of a device by means of which the method according to the invention can be carried out.

The device shown in FIG. 1 has a reaction vessel 15 in which silicon nitride is formed and is applied to a substrate. The supply vessel 9 contains hydrazine and the supply vessel 13 contains monosilane. The reaction vessel 15 is connected together with the supply vessels 9 and 13, the mixing vessel 10 and the manometer 21 to a tube 22.

Prior to the application of the silicon nitride layer, the device is exhausted at 3 with opened cocks 1, 2, 4, 5 and 6 and closed cocks 7 and 8. Subsequently, the cocks 1, 2, 4, 5 and 6 are closed.

The supply vessel 9 contains liquid $N_{2H4}$; the cock 7 is now opened so that a part of the tube system limited by the socks 1, 2, 4, 5 and 6 is filled with hydrazine vapor at a pressure of approximately 1 cm. Hg. This part has a volume of 300 mls. The cock 7 is then closed. Subsequently, cock 6 is opened. The latter gives access to a mixing vessel 10 having a volume of approximately 1 liter which communicates through a branch with a tubular vessel 11 of small volume which is cooled in a Dewar vessel 12. This cooling results in that substantially the whole quantity of hydrazine in the vessel 11 is condensed.

The supply vessel 13 contains $SiH_4$ gas at a pressure of approximately 1 atm. Cock 8 is now opened so that also the part of the connecting tube located between the cocks 4 and 8 is filled with $SiH_4$ gas. The volume of this part 14 is approximately 2 mls. and the pressure of the $SiH_4$ gas is approximately 1 atm. The cock 8 is then closed and the cock 4 is opened, whereupon the $SiH_4$ gas is also condensed in the vessel 11. Subsequently, cock 6 is closed and the mixture in the vessel 11 evaporates again while the mixing vessel 10 is filled with the vapor. Condensation and evaporation result in the constituents in the gaseous phase being rapidly and thoroughly mixed.

Subsequently, the cocks 6 and 2 are opened, which latter cock gives access to the reaction vessel 15. The volume of the reaction vessel 15 is approximately 1 liter. The reaction vessel 15 accommodates an open trough 16 filled with mercury which provides for the desired mercury vapor pressure of approximately 10'7E'3 Torr. This pressure corresponds to the saturated mercury vapor pressure at the ambient temperature. This temperature is lower than 35° C.

The semiconductor substrate 17 is disposed on a table 18 electrically heated by a helix 19. Due to this heating, the substrate attains a temperature of 50° C. so that condensation of mercury is completely avoided.

The low-pressure mercury vapor lamp 20 emits ultraviolet radiation under the influence of which the gas mixture reacts while forming silicon nitride which is deposited on the semiconductor substrate surface. In 1 hour, a layer of 0.2 $\mu$m. thickness is deposited.

When the cock 5 is opened, the system is connected to the manometer 21, which permits of constantly checking the pressure prevailing in the system.

Figure 2:
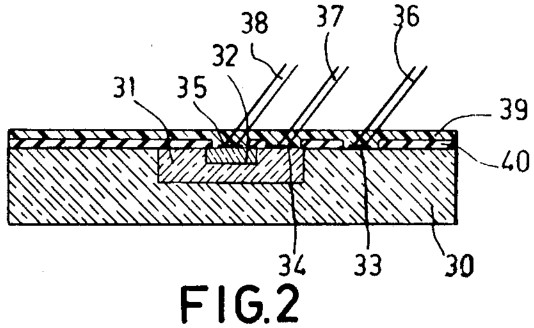
FIG. 2 is a vertical sectional view of a semiconductor device coated with a silicon nitride layer.

A semiconductor substrate thus treated has the appearance outlined in FIG. 2. It consists of an NPN transistor which is manufactured from a silicon wafer which is doped in known manner with the aid of a diffusion mask 40 by the planar technique.

Reference numeral 30 denotes the collector, reference numeral 31 the base and reference numeral 32 the emitter of this planar transistor. The collector, the base and the emitter are provided with aluminum contacts 33, 34 and 35, respectively, and with gold lead-in wires 36, 37 and 38, respectively. The transistor is screened by a silicon nitride layer 39. This screening by silicon nitride applied by the method according to the invention affords the advantage that the layer can be applied to a finished transistor at such a low temperature that the properties of the transistor are not influenced.

The method according to the invention is of course not limited to these uses. Moreover, with the device described, silicon nitride layers can be manufactured for the uses stated above, for example, as masking material for local diffusion of active impurities from the gaseous phase.

The method is not limited either to the use of monosilane and hydrazine. Besides the said monosilane and hydrazine, for example, the higher silanes and ammonia may also be used in the method according to the invention. Besides mercury, other substances such as Kr or Xe may be used in the method according to the invention. Kr and Xe are operative especially in the far ultraviolet range.

For certain uses, the silicon nitride layer should preferably be compressed by heating, for example, at 700° C. to 900° C. in an inert atmosphere.

Figure 3:
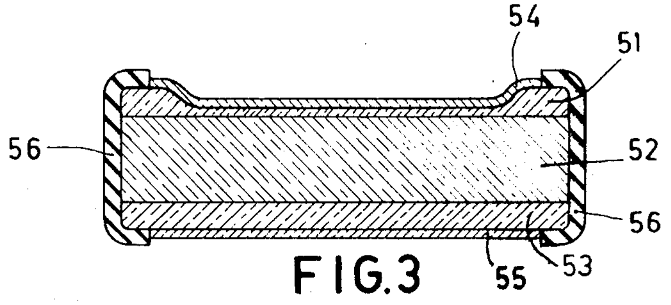
FIG. 3 is a vertical sectional view of a semiconductor device for detecting and/or measuring radiation which is provided with a silicon nitride layer.

A radiation detector to which a silicon nitride layer is applied by a method as described with reference to FIG. 1 is shown diagrammatically in sectional view in FIG. 3. The semiconductor body 51, 52, 53 of the detector may consist, for example, of germanium, of an $A^{IIIBV}$ compound or, as in the example described, of silicon. It has a P-type zone 51, an intrinsic zone 52 and an N-type zone 53. The zones 51 and 53 are provided with metal contacts 54 and 55, respectively.

The semiconductor body 51, 52, 53 of the detector may be manufactured entirely by a usual semiconductor technique and from usual materials. For example, the P-type zone consists of P-type silicon having a resistivity of 1,000 Ωcm. which is homogeneously doped with boron. The N-type zone 53 is applied, for example, by diffusion of lithium having a surface concentration, for example, in excess of $10^{17}$. The intrinsic zone 52 is obtained by a usual ion drift process, the concentration of boron in this zone being compensated for by the lithium concentration built up by lithium ions drifted from the zone 53. The metal contacts 54 and 55 may consist, for example, of gold or aluminum applied by vapor deposition.

According to the invention, the surface of the intrinsic zone 52 is coated with a layer of silicon nitride 56 having a thickness of, for example, 0.5 $\mu$. The layer 56 also covers the surfaces of the zones 51 and 53 as far as they are not provided with metal contacts. The silicon nitride deposited on the metal contacts 54 and 55 during the application of the layer 56 may be removed by local etching, for example, by brushing the metal surface with a piece of HF-impregnated wadding.

It should be noted that in the example described, the silicon nitride layer 56 is applied after the diffusion process and the ion drift process. If desired, this layer may be applied earlier, for example, between the diffusion process and the ion drift process or even before the diffusion process.

What is claimed is:

1. A method of applying a silicon nitride layer to a semiconductor substrate surface consisting essentially of the steps of forming a gaseous phase containing mercury and compounds of silicon and nitrogen exposing said gaseous phase to ultraviolet radiation of sufficient intensity to induce the aforesaid reaction and form silicon nitride on the surface of said substrate.

2. A method as claimed in claim 1, wherein the gaseous phase contains mercury vapor the pressure of which is equal to the saturated mercury vapor pressure at the ambient temperature.

3. A method as claimed in claim 1, wherein the silicon compound is a silane.

4. A method as claimed in claim 3, wherein the silicon compound is monosilane.

5. A method as claimed in claim 1, wherein the nitrogen compound is a nitrogen-hydrogen compound.

6. A method as claimed in claim 5, wherein the nitrogen-hydrogen compound is hydrazine.

7. A method as claimed in claim 1, wherein the silicon nitride is deposited on the surface of a semiconductor body which is coated with an oxide layer and in which at least 1 electrical circuit element is arranged.

* * * * *